United States Patent [19]

Baliga

[11] Patent Number: 4,782,379
[45] Date of Patent: Nov. 1, 1988

[54] SEMICONDUCTOR DEVICE HAVING RAPID REMOVAL OF MAJORITY CARRIERS FROM AN ACTIVE BASE REGION THEREOF AT DEVICE TURN-OFF AND METHOD OF FABRICATING THIS DEVICE

[75] Inventor: Bantval J. Baliga, Clifton Park, N.Y.
[73] Assignee: General Electric Company, Schenectady, N.Y.
[21] Appl. No.: 40,693
[22] Filed: Apr. 17, 1987

Related U.S. Application Data

[63] Continuation of Ser. No. 723,383, Apr. 15, 1985, abandoned, which is a continuation of Ser. No. 324,245, Nov. 23, 1981, abandoned.

[51] Int. Cl.⁴ .............................................. H01L 29/74
[52] U.S. Cl. ...................................... 357/38; 357/23.4; 357/43; 357/86; 357/89
[58] Field of Search ................... 357/23.4, 38, 43, 86, 357/89

[56] References Cited

U.S. PATENT DOCUMENTS

| | | | |
|---|---|---|---|
| 3,324,359 | 6/1967 | Gentry | 357/38 |
| 3,727,116 | 4/1973 | Thomas et al. | 357/86 |
| 4,223,328 | 9/1980 | Terasawa et al. | 357/38 |
| 4,275,408 | 6/1951 | Yokimoto | 357/38 |
| 4,337,474 | 6/1982 | Yokimoto | 357/13 |
| 4,356,503 | 10/1982 | Shafer et al. | 357/20 |
| 4,364,073 | 12/1982 | Becke et al. | 357/23.4 |
| 4,514,747 | 4/1985 | Miyata et al. | 357/86 |

FOREIGN PATENT DOCUMENTS

| | | | |
|---|---|---|---|
| 3011484 | 10/1980 | Fed. Rep. of Germany | 357/38 T |
| 52-2287 | 1/1977 | Japan | 357/38 G |
| 53-16584 | 2/1978 | Japan | 357/38 G |

*Primary Examiner*—Joseph E. Clawson, Jr.
*Attorney, Agent, or Firm*—Robert Ochis; James C. Davis, Jr.; Marvin Snyder

[57] ABSTRACT

A semiconductor device comprising a bulk substrate and an epitaxial layer grown thereon attains the feature of rapid removal of majority carriers from an N-type active base region thereof, a function conventionally performed by anode shorts, through the incorporation into the otherwise P-type substrate of a highly doped, N-type region having a surface in contact with the N-type epitaxial layer for injecting majority carriers from an N-type active base region in the epitaxial layer into the remaining P-type portion of the substrate.

31 Claims, 5 Drawing Sheets

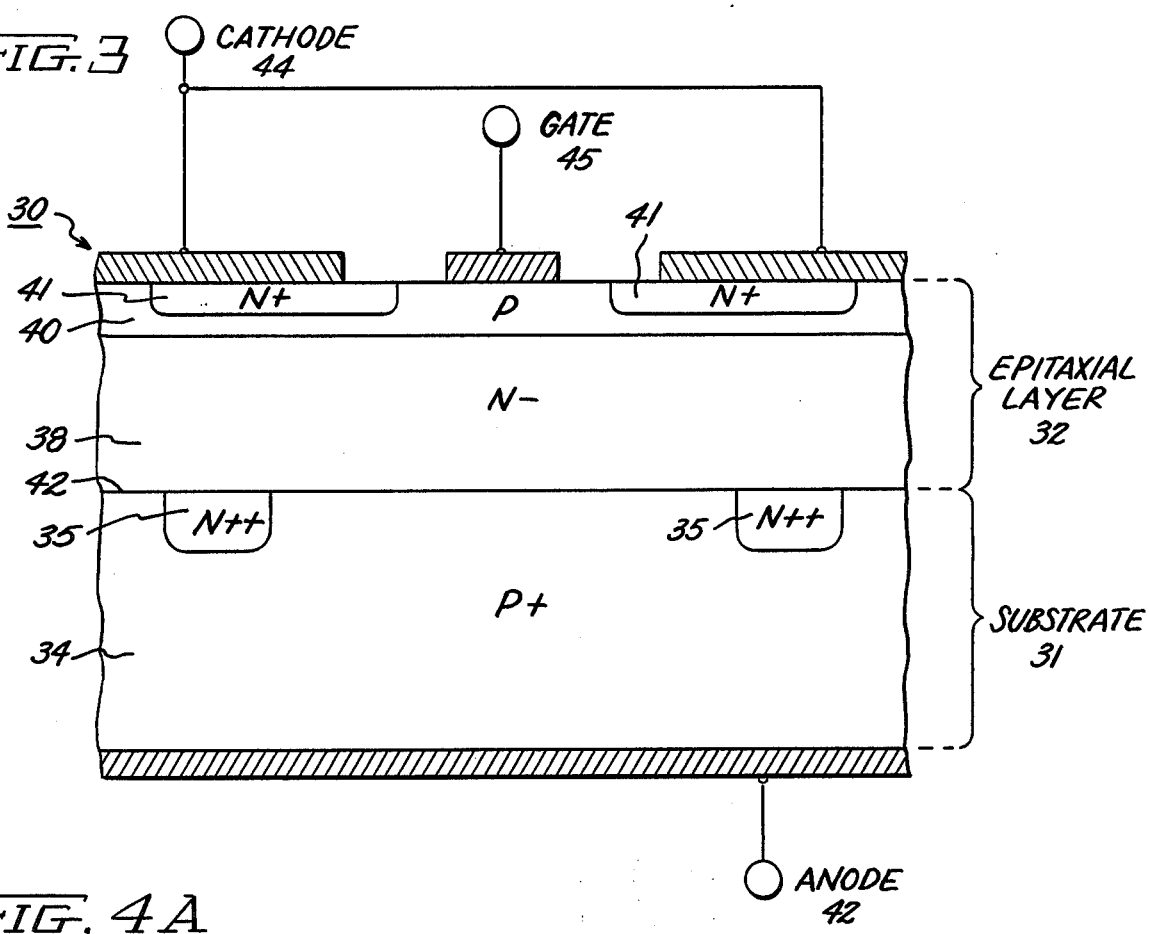
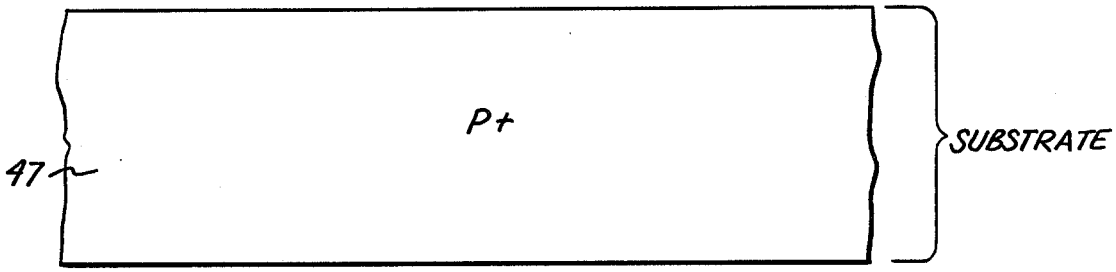

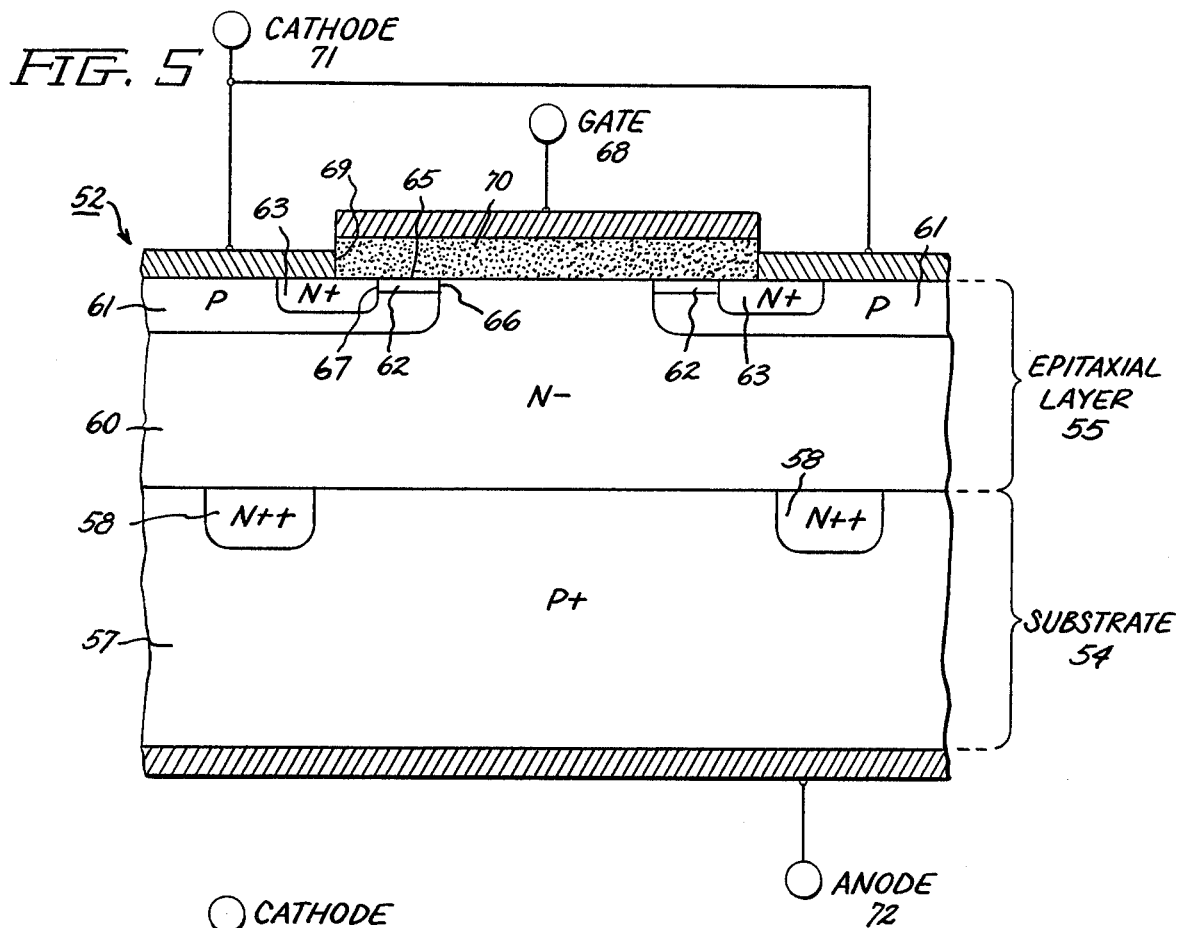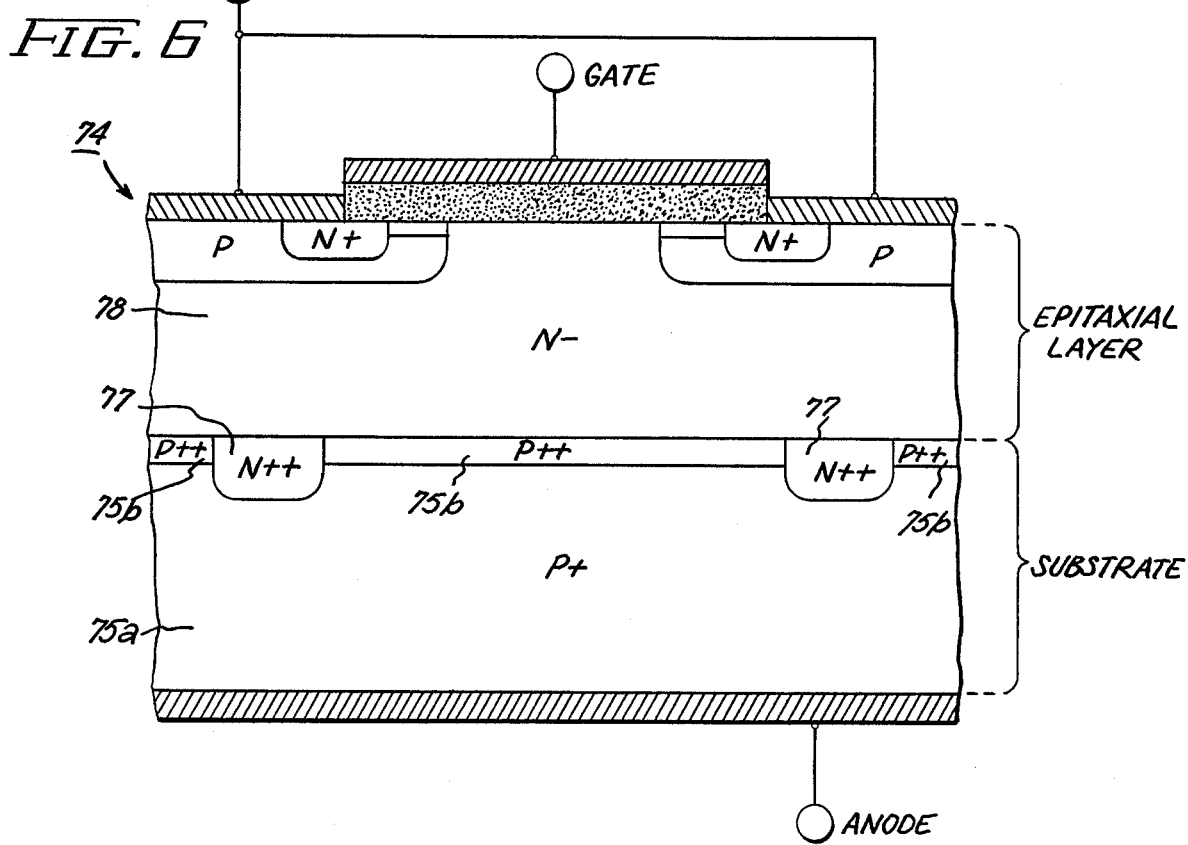

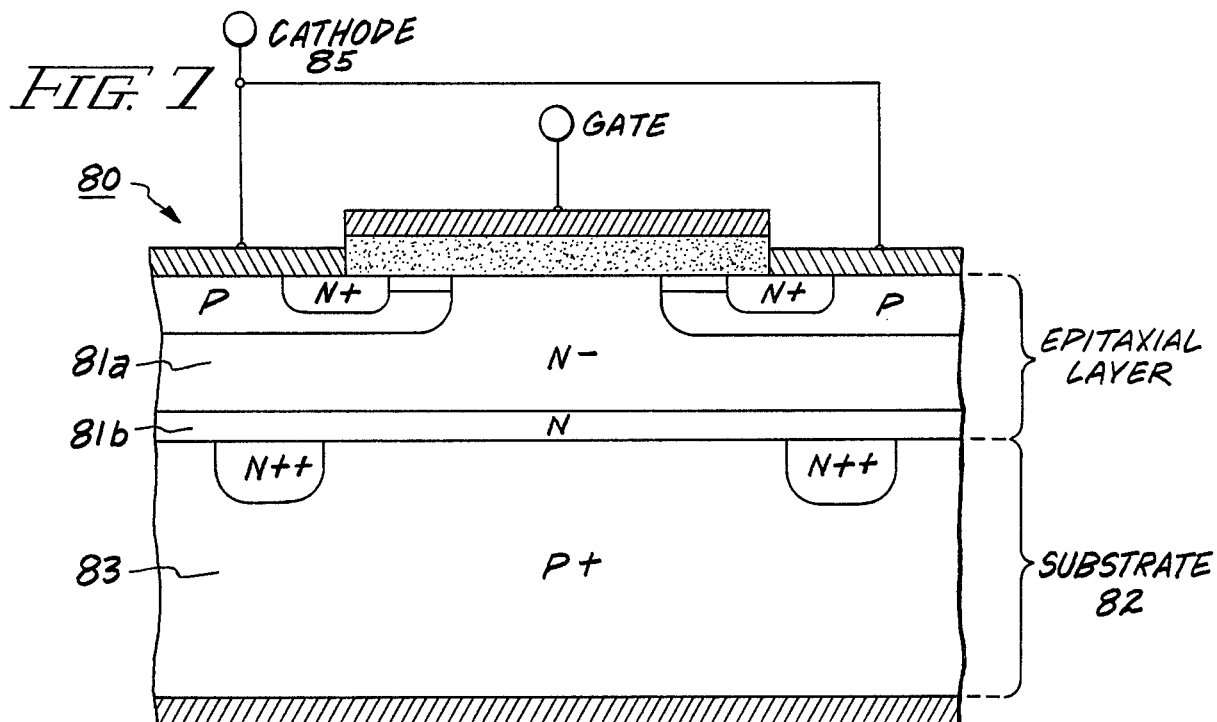
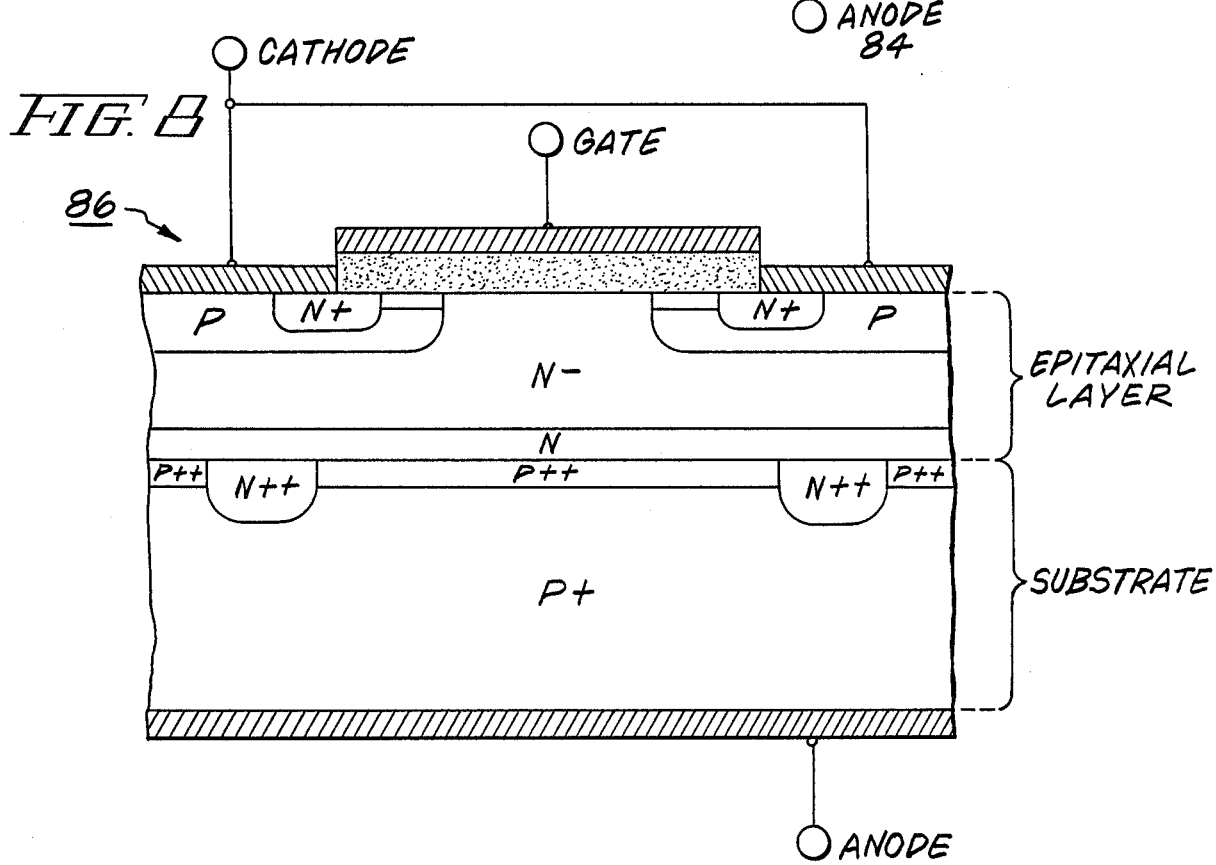

SEMICONDUCTOR DEVICE HAVING RAPID REMOVAL OF MAJORITY CARRIERS FROM AN ACTIVE BASE REGION THEREOF AT DEVICE TURN-OFF AND METHOD OF FABRICATING THIS DEVICE

This application is a continuation of application Ser. No. 723,383, filed Apr. 15, 1985, which is a continuation of application Ser. No. 723,383, filed Apr. 15, 1982, which is a continuation of application Ser. No. 324,245, filed Nov. 23, 1981, both now abandoned.

CROSS-REFERENCE TO RELATED APPLICATION

The present invention is related to U.S. patent application Ser. No. 212,181, by B. J. Baliga (the present inventor), filed Dec. 1, 1980, which is assigned to the present assignee.

BACKGROUND OF THE INVENTION

The present invention relates to a semiconductor device having the feature of rapid removal of majority carriers from the active base region thereof during turn-off of the device, and, further, to a method of fabricating such a device.

A typical prior art semiconductor device is shown in FIG. 1, illustrating a portion of a thyristor 10. The thyristor 10 comprises a lightly doped, N-type, or "N−", bulk wafer 11, into which P+ emitter regions 12, as well as a P base region 14 and N+ emitter regions 15 have been diffused. The remaining N− region 17 comprises an active base region. The thyristor 10 is a three terminal device, having an anode 18, a cathode 20, and a gate 21; and the operation thereof is well known in the art.

At interface regions 22 of the thyristor 10, the anode 18, which usually is metallic, makes direct electrical contact with the N− active base region 17. Such a feature is known in the art as an "anode short". It is known in the art that the metal-semiconductor interface regions 22 each typically have the characteristic of a high carrier recombination velocity. Thus when turn-off of the thyristor 10 is initiated, majority carriers in the N− active base region 17 (electrons, here) are able to rapidly recombine with holes at the interface regions 22, thereby achieving rapid removal of the majority carriers from the N− active base region 17. The significance of this is that the time required for turn-off of the thyristor 10 is reduced.

In the thyristor 10, however, the width of the N− active base region 17 (that is, the vertical dimension thereof in FIG. 1) is quite large, relatively speaking, and typically is about 10 mils. Having such a large active base region width enables the thyristor 10 to properly operate with, or block, relatively large voltages between the anode 18 and cathode 20, such voltages being, for example, in the order of 2000 volts. Often it occurs that a semiconductor device only needs to block a relatively low voltage, such as, by way of example, 1000 volts. The active base region width of such a low voltage device optimally is much narrower than the N− active base region width of the thyristor 10, in order to reduce the voltage drop between the anode 18 and the cathode 20 during forward conduction of the thyristor 10, and, also, to reduce the required amount of semiconductor material, and, by way of example, such width can be in the order of 100 microns.

It is not practical to fabricate such low voltage semiconductor devices with narrow active base region widths solely from bulk wafers, as is the case with the thyristor 10, above, due to the inherent problems that would arise from the use of an extremely thin and thus fragile bulk wafer. Accordingly, as is known in the art, in order to fabricate such semiconductor device with narrow active base regions, it is necessary to epitaxially grow an active base region on a substrate which comprises a bulk wafer and whch constitutes a highly doped region, corresponding to the P+ emitter regions 12 of the above thyristor 10. However, it is not possible, at least using diffusion technology, to fabricate such devices which incorporate metal-semiconductor interface regions between the active base region and the anode of the device, as is the case with regions 22 of the thyristor 10. The same problem applies to prior art thyristor 24 of FIG. 2 illustrating a modification of the thyristor 10, above. The thyristor 24 has an active base region comprising a lightly doped N− portion 25 and a more heavily doped N portion 27. As is known in the art, the presence of the more heavily doped N portion 27 between the N− portion 25 and P+ emitter regions 28 enables the width of the active base region of the device to be reduced.

OBJECTS OF THE INVENTION

Accordingly, it is an object of the invention to provide a semiconductor device having an epitaxial layer containing an active base region and which is deposited on a substrate comprising bulk material and which device incorporates appropriate structure to enable rapid removal of majority carriers from the active base region thereof during turn-off of the device.

A further object of the invention is to provide a method of fabricating a semiconductor device having the foregoing features.

SUMMARY OF THE INVENTION

In carrying out the former object of the present invention, there is provided a semiconductor device having the feature of removal of majority carriers from an active base region thereof during turn-off of the device. The semiconductor device comprises a semiconductor substrate, a first electrode, an epitaxial layer, and a second electrode. The substrate comprises at least in part bulk type material. The substrate further comprises first and second regions. The first region is doped to one conductivity type and the second region is doped to the opposite conductivity type. At least a major portion of the first region is doped to a first concentration. The first concentration is equal to at least about $5 \times 10^{17}$ dopant atoms per cubic centimeter. The second region is doped to a second concentration which is at least as high as the first concentration. The substrate has a first surface comprising in part a surface of the second region and, in further part, a surface of the first region. The first electrode is electrically connected to a second surface of the substrate comprising a further surface of the first region. The epitaxial layer is deposited on the substrate first surface and comprises at least third and fourth regions. The third region separates the substrate second region from the epitaxial layer fourth region. The third region is doped to the opposite conductivity type and the fourth region is doped to said one conductivity type. At least a major portion of the third region is doped to a third concentration substantially lower than the first concentration. A major portion of the fourth region is doped to a fourth concentration substantially higher than the third concentration. The second electrode is electrically connected to at least a surface of the epitaxial layer fourth region. The presence of the substrate second region in the device provides the device with the desired feature of rapid removal of majority carriers from an active base region thereof during device turnoff. In carrying out the latter object of the invention, there is provided a method of fabricating a semiconductor device having the feature of rapid removal of majority carriers from an active base region thereof. The method comprises the steps of providing a semiconductor substrate, comprising a bulk wafer doped to one conductivity type, and having a first doping concentration equal to at least about $5 \times 10^{17}$ dopant atoms per cubic centimeter introducing through part of a first principal surface of the substrate at least one first region of the opposite conductivity type, with the first region having a second doping concentration which is at least as high as the first concentration: and epitaxially growing a layer of semiconductor material of the opposite conductivity type upon the substrate principal surface, with a major portion of the epitaxial layer having a third doping concentration substantially lower than the first concentration. The presence of the substrate first region provides the resulting device with the desired feature of rapid removal of majority carriers from an active base region thereof during device turnoff.

BRIEF DESCRIPTION OF THE DRAWING FIGURES

The features of the invention believed to be novel are set forth with particularity in the appended claims. The invention itself, however, both as to organization and method of operation, together with further objects and advantages thereof, may best be understood by reference to the following description taken in conjunction with the accompanying drawing figures in which:

FIG. 3 is a schematic, cross-sectional view of a portion of a semiconductor device incorporating one embodiment of the present invention;

FIGS. 4A-4D are schematic, cross-sectional views illustrating steps in the fabrication of semiconductor devices according to the present invention;

FIG. 5 is a schematic, cross-sectional view of a portion of a semiconductor device incorporating a further embodiment of the present invention;

FIG. 6 is a view similar to FIG. 5 illustrating a modification of the semiconductor device of FIG. 5;

FIG. 7 is a view also like FIG. 5 illustrating a further modification of the semiconductor device of FIG. 5; and FIG. 8 is a view also like FIG. 5 illustrating a still further modification of the semiconductor device of FIG. 5.

DETAILED DESCRIPTION OF THE INVENTION

Figure 1:
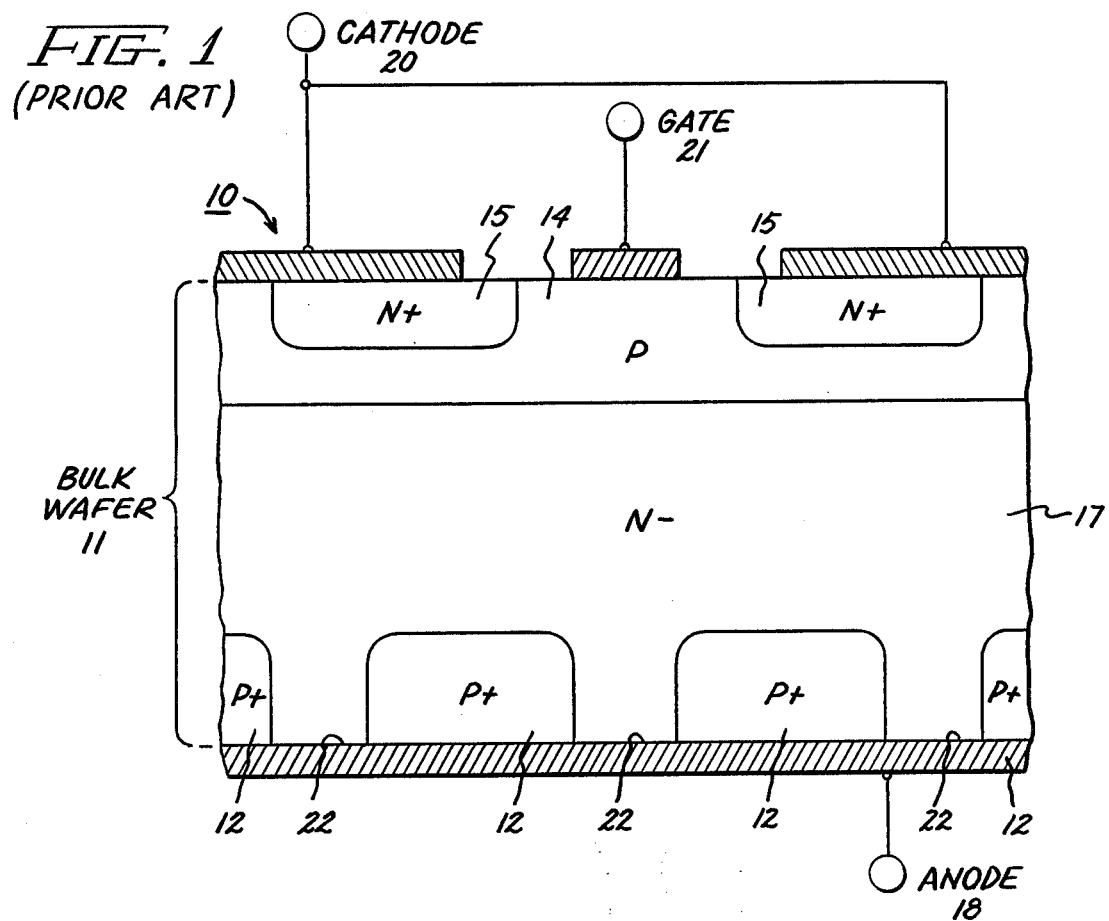
FIG. 1 is a schematic, cross-sectional view of a portion of a prior art semiconductor device.
Figure 2:
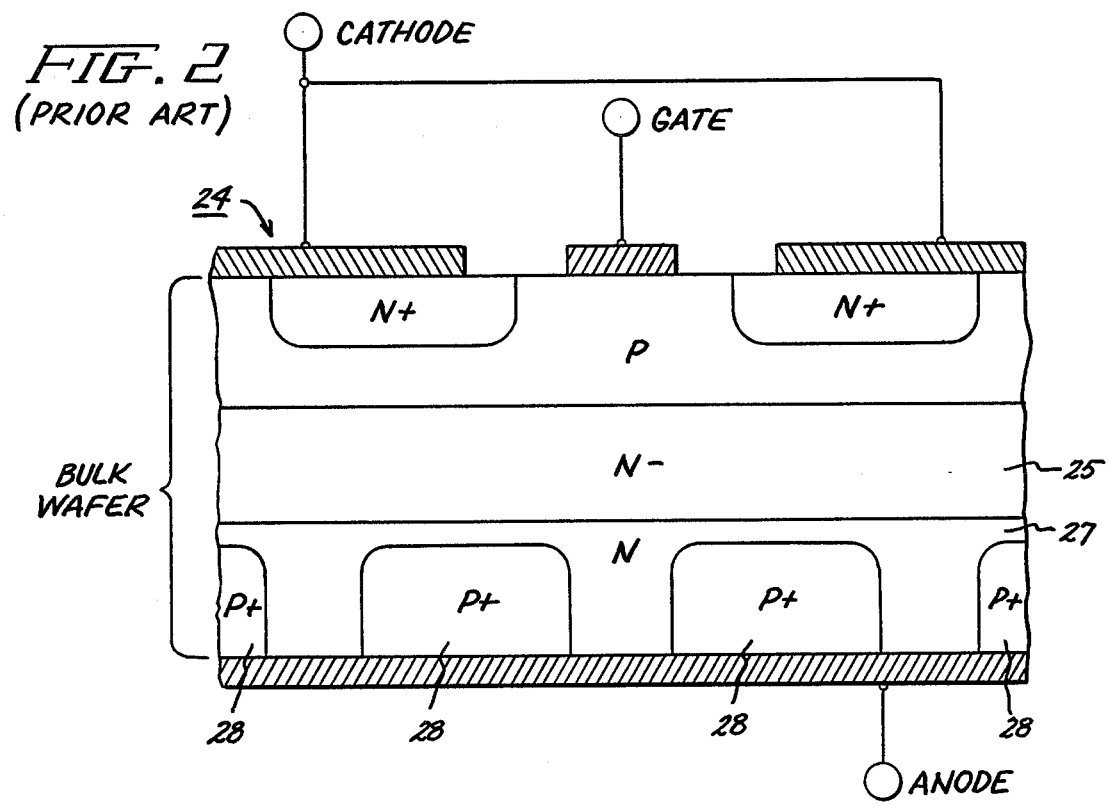
FIG. 2 is a view similar to FIG. 1, showing a prior art modification of the device of FIG. 1.

In FIG. 3, a semiconductor device 30 comprising a thyristor in accordance with the invention is shown. The device 30 comprises a substrate 31 and an epitaxial layer 32, grown over the substrate 31. The substrate 31 comprises at least in part bulk material and it preferably is comprised entirely of a bulk wafer. The substrate 31 comprises a first region 34 and second regions 35. The first region 34 is doped P-type and has a doping concentration at least about $5 \times 10^{17}$ dopant atoms per cubic centimeter, and preferably about $10^{18}$ dopant atoms per cubic centimeter. The second regions 35 are doped N-type and have a doping concentration at least as high as the doping concentration of the first region 34, and which preferably is about $10^{20}$ dopant atoms per cubic centimeter.

The epitaxial layer 32 comprises a third region 38, a fourth region 40, and fifth regions 41. The third region 38 separates the fourth and fifth regions 40 and 41 from the substrate 31; and the fourth region 40 separates the fifth regions 41 from the third region 38. The third region 38 consitutes an active base region in the device 30, is doped N-type, and has a doping concentration substantially lower than that of the substrate first region 34, and which is preferably in the range from about $10^{13}$ to $10^{15}$ dopant atoms per cubic centimeter. As used herein in regard to doping concentration, "substantially" lower or higher means at least about one order of magnitude lower or higher. The third region 38 adjoins a first principal surface 42 of the substrate 31, which comprises in part a surface of the substrate first region 34, and, in further part, a surface of the substrate second regions 35. The epitaxial layer fourth region 40 is doped P-type and has a doping concentration substantially higher than the doping concentration of the third region 38. The fifth regions 41 are doped N-type and have a doping concentration substantially higher than the doping concentration of the fourth region 38.

The semiconductor device 30 is a three-terminal device with an anode 42 electrically connected to the substrate first region 34, a cathode 44 electrically connected to the epitaxial layer fourth region 40 and also to the fifth region 41, and a gate 45 electrically connected to the fourth region 40. As will be apparent to those skilled in the art, the gate 45 can be replaced by various other gate means for rendering the device 30 conductive between the anode and cathode 42 and 44.

The width of the third or active base region 38, in accordance with the invention, is capable of having a reduced dimension where the semiconductor device 30 only needs to block low voltage as used herein, low means relative to the blocking voltage capability of the prior art thyristor 10, above. Further, in accordance with the invention, upon turn-off of the device 30 being initiated, majority carriers in the third region 38 (electrons, here) are rapidly transferred to the substrate first region 34, due to the presence of the substrate second regions 35 in the device 30. This is because the majority carriers, or electrons here, in the third region 38 are attracted to the highly doped N-type substrate second regions 35, due to the lower resistance thereof to electron current flow and to the attraction provided to electrons by a positive potential at the anode 40 during turn-off of the device 30. The second regions 35 thereupon serve as efficient injectors of electrons into the substrate first region 34, especially where the doping concentration of the second regions 35 exceeds that of the first region 34. The electrons thus injected into the first region 34 rapidly recombine with holes, which are the predominant or majority carriers in the P+ region 34. Additionally, some of the electrons that enter the second regions 35 from the third region 38 combine with holes that, statistically speaking, enter the second regions 35 from the first region 34. The ultimate significance of the inventive semiconductor device 30 having the feature of rapid removal of majority carriers from an active base region thereof during turn-off of the device is that time required for turn-off to be completed is significantly reduced.

Figure 4C:
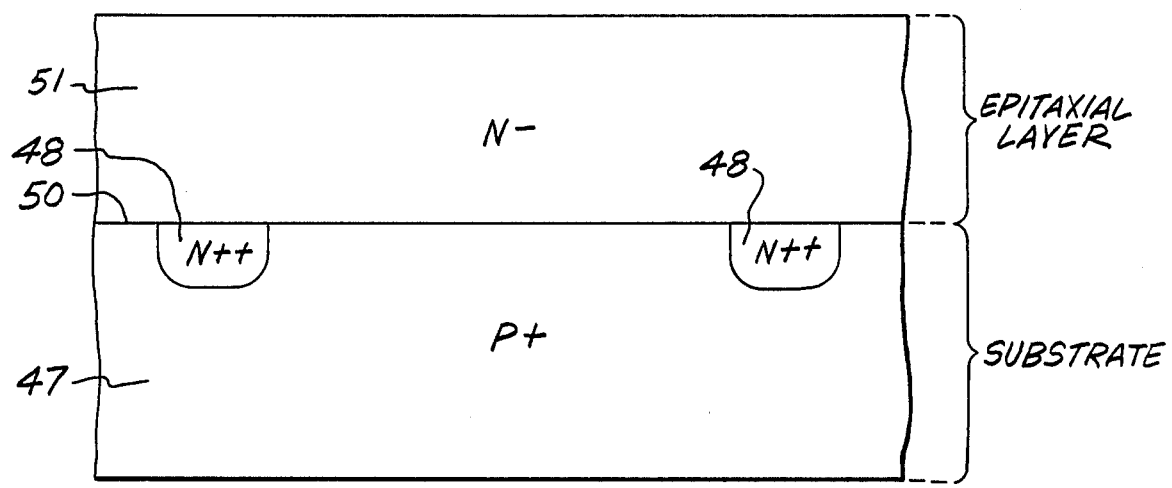
Figure 4D:
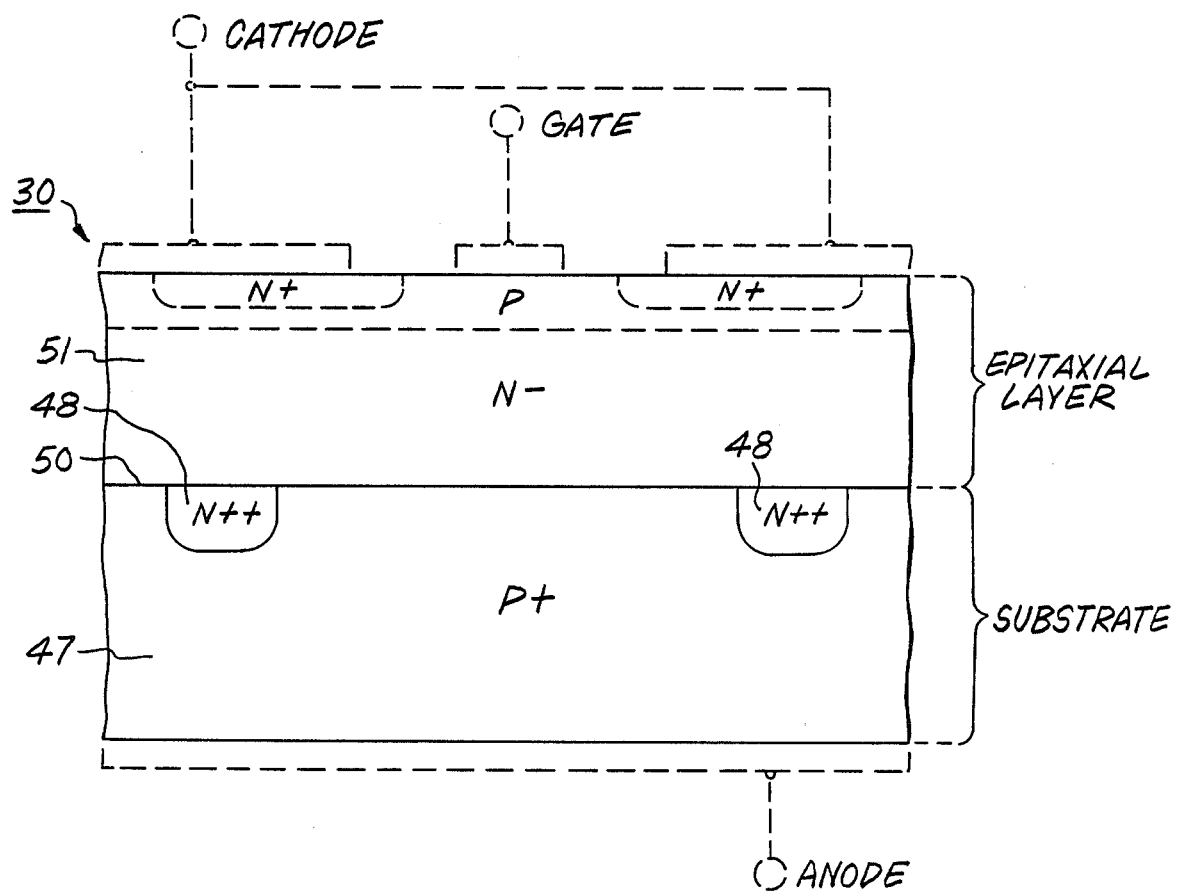

A preferred method of fabricating the above semiconductor device 30 is illustrated with respect to FIGS. 4A-4D. In FIG. 4A, a bulk wafer 47, doped P-type and having a doping concentration at least about $5 \times 10^{17}$ dopant atoms per cubic centimeter, and preferably about $10^{18}$ thus dopant atoms per cubic centimeter, is provided. As indicated in FIG. 4B, N++ regions 48 are introduced through a first principal surface 50 of the substrate 47, preferably with a planar diffusion of phosphorus or antimony, or a combination thereof. The N++ regions 48 can have various shapes, such as individual dots, stripes, or a singular, interconnected grid pattern, by way of example. Hereafter, the substrate second regions, or N++ regions 48 in FIG. 4B, are simply referred to in the plural sense.

FIG. 4C illustrates an N⁻ type epitaxial layer 51 grown on a substrate principal surface 50. The growing of the epitaxial layer 51 is preferably accomplished with vapor phase epitaxy, a known technique in the art. After the epitaxial layer 51 is grown, the remaining parts of the semiconductor device 30, indicated by phantom lines in FIG. 4D, can be fabricated using well known techniques.

Turning to FIG. 5, there is shown a further semiconductor device 52 incorporating the advantagesof the present invention. Certain features of the device 52, which will become more apparent below, were disclosed and claimed in my earlier U.S. patent application, Ser. No. 212,181, filed Dec. 2, 1980, assigned to the same assignee as the present application, and which is incorporated herein by reference.

In correspondence with the above semiconductor device 30, the semiconductor device 52 comprises a substrate 54 and an epitaxial layer 55 on the substrate 54. The substrate 54 comprises a first region 57 and second regions 58, which are suitably identical to the corresponding regions of the device 30. The epitaxial layer 55 comprises a third region 60, which constitutes an active base region of the device 52, and which is suitably doped the same as the corresponding region of the device 30. The epitaxial layer 55 further comprises fourth regions 61, fifth regions 62, and, preferably but optionally, as is discussed more fully below, sixth regions 63. The left-hand side of the device 52 as shown in FIG. 5 is suitably symmetrical with the right-hand side, and, therefore, only the left-hand side is discussed in detail below.

The fourth region 61 adjoins the third region 60 and is separated from the substrate 54 by the third region 60; the fifth region 62 adjoins the third and fourth regions 60 and 61 and is separated from the substrate 54 by the third region 60: and the sixth region 63 adjoins the fourth and fifth regions 61 and 62 and is separated from the third region 60 by the fourth and fifth regions 61 and 62. The fifth region 62 has a free surface 65. As used herein, a "free surface" is a surface located at the exterior of the semiconductor body of the respective semiconductor device, which semiconductor body comprises a substrate with an epitaxial layer thereon. Thus, the free surface 65 of the fifth region 62 is a surface located at the exterior of the epitaxial layer 55. A first junction 66 between the third and fifth regions 60 and 62 has a portion terminating at an exterior surface of the epitaxial layer 55, such surface being the upper surface of the layer 55 in FIG. 5. Like the first junction 66, a further, or second, junction 67 between the fifth and sixth regions 62 and 63 has a portion terminating at an exterior surface of the epitaxial layer 55, such surface also being the upper surface of the layer 55 in FIG. 5. A gate 68 is separated from the epitaxial layer 55 by an insulative layer 70. The gate 68 covers an area on the epitaxial layer 55 including at least part of the fifth region free surface 65, from a location proximate the aforesaid terminated portion of the first junction 66, extending toward the cathode 71(that is, toward the left in FIG. 5), and to a location proximate the aforesaid terminated portion of the second junction 67. The gate 68, the insulative layer 70, and the fifth region 62 are so constructed and arranged that the fifth region 62 completes a current path for majority carriers in the third region 60 (electrons,here), which current path connects together the third region 60 and the sixth region 63, which is electrically connected to the cathode 71, upon suitable biasing of the gate 68.

What constitutes suitable biasing of the gate 68 depends upon the doping type of the fifth region 62, which can be either P-type or N-type. If it is P-type, the gate 68 would need to be biased with a positive voltage of sufficient magnitude to induce an inversion layer in the fifth region 62, immediately beneath the insulative layer 70, and extending between the third and sixth regions 60 and 63. Such an inversion layer is characterized by having a predominance of electrons therein. Accordingly, device current comprising electrons can flow from the cathode 71, through the N+ sixth region 63, which advantageously has a low resistance to electron current, through the inversion layer within the fifth region 62, and into the N-type third region 60. Within the third region 60, which constitutes the active base region of the device 52, injected holes from the first region 57 recombine with electrons of the foregoing electron current originating from the cathode 71. With the fifth region 62 comprising P-type material, as just discussed, the semiconductor device 52 would be characterized in the art as a normally-off device, because without the gate 68 biased, the fifth region 62 does not offer a low resistance current path for the electrons between the third region 60 and the sixth region 63.

On the other hand, if the fifth region 62 comprises N-type material, electron current can flow therethrough in a current path between the sixth region 63 and the third region 60 without the presence of a biasing voltage on the gate 68. A semiconductor device 52 of this type would be characterized in the art as a normally-on device.

As briefly mentioned above, the presence of the sixth region 63 in the device 52 is preferable,but optional. If it is deleted, then the left-hand fifth region 62 in FIG. 5 would extend to the left to at least a location 69, proximate the closest portion of the cathode 71. The gate 68 would then cover an area on the epitaxial layer 55 including at least part of the fifth region free surface 65, from a location proximate the aforesaid terminated portion of the junction 66, extending towards the cathode 71, and to at least the portion of the cathode 71 nearest to the aforesaid terminated portion of the junction 66. The gate 68, the insulative layer 70, and the fifth region 62 would be so constructed and arranged that the fifth region 62 completes a current path for majority carriers in the third region 60 which current path connects together the third region 60 and the cathode 71 upon suitable biasing of the gate 68, such suitable biasing being as discussed above.

A preferred method of fabricating the semiconductor device 52 follows the same steps as discussed above with respect to FIGS. 4A–4C. Fabrication of the parts in addition to the structure shown in FIG. 4C, in order to arrive at the semiconductor device 52 of FIG. 5, can be accomplished, in light of the present description, using well known techniques.

In FIG. 6, a modification of the above semiconductor device 52 is illustrated as a semiconductor device 74. In the device 74, a substrate first region 75 comprises a major portion 75a and a minor portion or portions 75b, depending on the configuration of second regions 77(hereinafter "minor portion 75b"). The major portion 75a suitably is substantially alike the first region 57 of the device 52 shown in FIG. 5. The minor portion 75b, however, has a doping concentration substantially higher than that of the major portion 75a. The doping of the minor portion 75b, however, should be less than that of the substrate second regions 77, in order that the upper portions of the second regions 77 remain N-type. By way of example, the minor portion 75b suitably is doped to about $10^{19}$ dopant atoms per cubic centimeter, and the second regions 77 are suitably doped to a concentration of dopant atoms per cubic centimeter. The presence of the P++ minor portion 75b in the semiconductor device 74, during turn-off, improves the efficiency of electron injection from the second regions 77 into minor portion 75b, due to a tunneling effect which occurs in the interface regions between the second regions 77 and the minor portion 75b. The ultimate significance of increasing such injection efficiency is to reduce the time required to turn off the device 74. In order for the foregoing tunneling effect to occur, it is not necessary that the minor portion 75b adjoin the epitaxial layer third region 78, but it is advantageous to do so in order to improve hole injection from the first region 75 into the third region 78 during device operation in the "on" or conducting state. A P++ first region minor portion, corresponding to the minor portion 75b of the semiconductor device 74, could also be incorporated into the semiconductor device 30 of FIG. 5, described above.

In fabricating the minor portion 75b of the semiconductor device 74, it is preferable that a blanket "introduction", preferably comprising a boron diffusion, of the P++ minor portion 75b be made to the upper surface of a substrate, such as the substrate 47 of FIG. 4A, or alternatively, to the substrate 47 of FIG. 4B; in other words, either before or after the introduction of the N++ regions 48 of FIG. 4B, although after is preferred.

A further modification of the semiconductor device 52 of FIG. 5 is shown as semiconductor device 80 of FIG. 7. In device 80, a third region 81 comprises a major portion 81a, suitably doped to the same concentration as the third region 60 of the semiconductor device 52 of FIG. 5, and a minor portion 81b, which has a doping concentration substantially higher than that of the major portion 81a but lower than that of the major portion of the substrate first region 83. By having the more highly doped minor portion 81b adjoining the upper surface of the substrate 82 and separating the major portion 81a from the substrate 82, the width (that is,/the vertical dimension in FIG. 7) of the third region 81, constituting an active base region of the device 80, advantageously can be less than the width of the third region 60 of the device 52 in order to decrease the voltage drop between the anode 84 and cathode 85 during forward conduction of the device 80, and, also, to reduce the required amount of semiconductor material. An N-type minor minor portion, corresponding to the minor portion 81b of device 80, can also be incorporated into the semiconductor device 30 (of FIG. 3), described above, whereby the width of the active base region thereof can be reduced.

In fabricating the epitaxial layer minor portion 81b, the substrate 47, shown in FIG. 4B, is provided with a first epitaxial layer growth, doped to the desired concentration, grown on the top surface thereof. Thereafter, a second epitaxial layer growth is provided on top of the first epitaxial layer growth, thereby completing the epitaxial layer, having a lightly doped N-type portion, out of which the major portion 81a is formed, and a more heavily doped N-type portion which forms the minor portion 81b of the semiconductor device 80.

The modification of the semiconductor device 74 of FIG. 6 and the modification of the semiconductor device 80 of FIG. 7 can be incorporated into the same device, and, as such, would appear as semiconductor device 86 of FIG. 8. The modifications of the device 86 could also be incorporated into the semiconductor device 30 of FIG. 3.

From the foregoing it will be appreciated that the present invention provides a semiconductor device having the feature of rapid removal of majority carriers from an active base region thereof during turn-off of such device, whereby the time of turn-off thereof is reduced. Additionally, it can be appreciated that the invention provides a method of fabricating a sericonductor device having this feature. Additionally, further advantages and features of the present invention will be apparent to those skilled in the art. For example, the incorporation of the N++ substrate second regions in the above semiconductor devices improves the breakdown voltages of the respective devices, due to the consequent reduction in injection efficiency of the P+ substrate first region at low current levels. Further, the N++ substrate second regions in the semiconductor device 30 of FIG. 3 serve to reduce the sensitivity of the device to spurious turn-on due to noise and thermal currents generated in the semiconductor material thereof.

While only certain preferred features of the invention have been shown by way of illustration, many modifications and changes will occur to those skilled in the art. For example, an alternative introduction technique to the various diffusion implantations of the N++ substrate second regions and P++ minor portions is multiple doping ion implantation to reduce stresses in the N++ substrate second regions and in the P++ minor portions Further, the invention applies to comptementary devices, wherein P-type regions are used in place of the N-type regions described herein, and vice-versa. In such a case, a boron diffusion should be used in place of a phosphorous or antimony diffusion, and vice-versa. Still further, the N++ substrate second regions and P++ minor portions could be fabricated by techniques other than the one specifically described herein. For example, they could be fabricated by epitaxial growth on a bulk wafer. It is, therefore, to be understood that the appended claims are intended to cover all such modifications and changes as fall within the true spirit and scope of the invention.

What is claimed as my invention and desired to be secured by Letters Patent of the United States is:

1. A semiconductor device having the feature of rapid removal of majority carriers from an active base region thereof during turn-off of the device, comprising:
   (a) a semiconductor substrate comprising first and second regions; said first region being doped to one conductivity type and said second region being doped to the opposite conductivity type; at least a major portion of said first region adjacent said second region being doped to a first concentration; said first concentration being equal to at least $5 \times 10^{17}$ dopant atoms per cubic centimeter; said second region being doped to a second concentration which is at least as high as said first concentration; said substrate having a first surface comprising in part a surface of said second region and in further part a surface of said first region; said substrate having a second surface comprising a portion of said first region;
   (b) a first main electrode disposed on said second surface of said substrate, said first electrode (1) being ohmically connected to said first region, (2) not being ohmically connected to said second region and (3) being spaced from said second region;
   (c) a semiconductor layer disposed on said first surface of said substrate and comprising at least third and fourth regions; said third region comprising said active base region and separating said substrate from said layer fourth region; said third region being doped to said opposite conductivity type and said fourth region being doped to said one conductivity type; at least a major portion of said third region being doped to a third concentration substantially lower than said first concentration; a major portion of said fourth region being doped to a fourth concentration substantially higher than said third concentration;
   (d) second main electrode ohmically connected at least to a surface of said fourth region; and
   (e) a gate electrode contiguous with said fourth region, said gate electrode, when appropriate main bias is applied between said first and second main electrodes, being responsive to an appropriately applied gate bias to render said device conductive between said first and second main electrodes;
   (f) whereby when said device has been rendered conductive between said first and second main electrodes and said appropriate main bias is removed from said first and second main electrodes, opposite type conductivity carriers in said third region are rapidly transferred to said first region by being attracted toward and into said second region, causing said second region to effficiently inject opposite type conductivity carriers into said first region where said injected opposite type carriers combine with one type conductivity carriers in said first region to rapidly turn said device off.

2. The device according to claim 1 wherein the interface between said substrate first region and said semiconductor layer lies substantially in a single plane and the center of said substrate second region is situated between said plane and said second substrate surface.

3. The device according to claim 2 wherein said substrate second region has a doping concentration which is substantially higher than said first concentration.

4. The device according to claim 2 wherein a minor portion of said first region adjoining said second region has a fifth doping concentration substantially higher than said first concentration.

5. The device according to claim 4 wherein said first region minor portion additionally adjoins said layer.

6. The device according to claim 2 wherein a minor portion of said third region adjoining said substrate first surface and separating said third region major portion from said substrate is doped to a fifth concentration substantially higher than said third concentration but lower than said first concentration.

7. The semiconductor device of claim 2 wherein said gate electrode is an insulated-gate electrode in which the conductive portion of said insulated gate electrode is electrically insulated from said second electrode by an insulating portion of said insulated gate electrode which is contiguous with said second electrode;
   said insulated-gate electrode, only in response to an applied gate bias, inducing a channel through said fourth region beneath said insulated gate electrode, said channel conductively coupling opposite type carriers between said second electrode and said third region to render said semiconductor device conductive when said appropriate main bias is applied between said first and second main electrodes, and when said gate bias is removed repressing said channel through said fourth region to render said device nonconductive.

8. The device according to claim 7 further comprising:
   (a) a fifth region included in said layer; said fifth region adjoining said third and fourth regions, separated form said substrate by said third region, and having a free surface; a first junction between said third and fifth regions having a portion terminating at an exterior surface of said layer; and
   (b) said fifth region underlying said insulated gate electrode and comprising said channel in said fourth region, said insulated gate electrode covering an area on said layer including at least part of said fifth region free surface from a location proximate said terminated portion of said first junction and extending towards said second electrode.

9. The device according to claim 8 wherein said fifth region is doped to said one conductivity type.

10. The device according to claim 8 wherein said fifth region is doped to said opposite conductivity type.

11. The device accordingly claim 8 further comprising a sixth region doped to said opposite conductivity type, adjoining said fourth and fifth region, separated from said third region by said fourth and fifth regions, and having a sixth doping concentration substantially higher than said fourth concentration; a second junction between said fifth and sixth regions having a portion terminating at an exterior surface of said semiconductor layer; and wherein said area on said semiconductor layer covered by said gate electrode extends from said location proximate said terminated portion of said first junction to a location proximate said terminated portion of said second junction, whereby said sixth region is in said current path connecting together said third region and said second electrode.

12. The device according to claim 2 wherein:
   (a) said semiconductor layer further comprises a fifth region, said fifth region being doped to said opposite conductivity type, adjoining said fourth region, being separated from said third region by said fourth region, and having a fifth doping concentration substantially higher than said fourth concentration; and (b) said second electrode is further electrically connected to said layer fifth region.

13. The device according to claim 12 further including gate means to render the device conductive between said first and second electrodes.

14. The device according to claim 1 wherein said one conductivity type is P-type and second opposite conductivity type is N-type.

15. The device according to claim 1 wherein said first concentration is equal to at least $10^{18}$ dopant atoms per cubic centimeter.

16. A semiconductor device exhibiting rapid removal of majority carriers from an active base region thereof during turn-off of the device, comprising:

(a) a semiconductor substrate comprised of first and second adjacent regions, said first region being doped to one conductivity type and said second region being doped to the opposite conductivity type, at least a major portion of said first region adjacent said second region being doped to a first concentration of at least $5 \times 10^{17}$ dopant atoms per cubic centimeter, said second region being doped to a second concentration at least as high as said first concentration;

(b) a semiconductor layer disposed on said substrate and forming a first interface therewith and comprising at least third and fourth regions;

(c) said second region extending to said first interface and having a configuration whereby for selected cross sections through said device perpendicular to said first interface, segments of said first and second regions alternate along said first interface;

(d) said layer third region comprising said active base region and separating said substrate from said layer fourth region, said third region being doped to said opposite conductivity type and said fourth region being doped to said one conductivity type, at least a major portion of said third region being doped to a third concentration substantially lower than said frist concentration, a major portion of said fourth region being doped to a fourth concentration substantially higher than said third concentration, said third and fourth regions having a second interface therebetween, said second interface being substantially in a single plane extending through said layer over an area which is sufficient to span at least two of said second region segments situated along a given one of said selected cross-sections;

(e) a first main electrode ohmically connected to a surface of said first region of said substrate, not ohmically connected to said second region and spaced from said second region;

(f) a second main electrode electrically connected to at least a surface of said fourth region; and (g) a gate electrode contiguous with said fourth region, said gate electrode, when an appropriate main bias is applied between said first and second main electrodes, being responsive to an appropriately applied gate bias to render said device conductive between said first and second main electrodes;

(h) whereby when said device has been rendered conductive between said first and second main electrodes and said appropriate main bias is removed from said first and second main electrodes, opposite type conductivity carriers in said third region are rapidly transferred to said first region by being attracted toward and into said second region, causing said second region to efficiently inject opposite type conductivity carriers into said first region where said injected opposite type carriers combine with one type conductivity carriers in said first region to rapidly turn said device off.

17. The semiconductor device according to claim 16 wherein said substrate second region has a doping concentration substantially higher than said first concentration.

18. The semiconductor device according to claim 16 wherein a minor portion of said first region adjoining said second region has a fifth doping concentration substantially higher than said first concentration.

19. The semiconductor device according to claim 18 wherein said first region minor portion additionally adjoins said semiconductor layer.

20. The semiconductor device according to claim 16 wherein a minor portion of said third region adjoining said substrate first surface and separating said third region major portion from said substrate is doped to a fifth concentration substantially higher than said third concentration but lower than said first concentration.

21. The semiconductor device of claim 16 wherein said gate electrode is an insulated-gate electrode in which the conductive portion of said insulated gate electrode is electrically insulated from said second electrode by an insulating portion of said insulated gate electrode which is contiguous with said second electrode;

said insulated-gate electrode, only in response to an applied gate bias, inducing a channel through said fourth region beneath said insulated gate electrode, said channel conductively coupling opposite type carriers between said second electrode and said third region to render said semiconductor device conductive when said appropriate main bias is applied between said first and second main electrodes and, when said gate bias is removed, repressing said channel through said fourth region to render said device nonconductive.

22. The semiconductor device according to claim 21 further comprising:

(a) a fifth region included in said semiconductor layer; said fifth region adjoining said third and fourth regions, separate from said substrate by asid third region, and having a free surface; a first junction between said third and fifth regions having a portion terminating at a exterior surface of said layer; and (b) said fifth region underlying said insulated gate electrode and comprising said channel in said fourth region, said insulated gate electrode covering an area on said semiconductor layer including at least part of said fifth region free surface from a location proximate said terminated portion of said first junction and extending towards said second electrode.

23. The semiconductor device according to claim 22 wherein said fifth region is doped to said one conductivity type.

24. The semiconductor device according to claim 23 wherein said fifth region is doped to said opposite conductivity type.

25. The device according to claim 22 further comprising a sixth region doped to said opposite conductivity type, adjoining said fourth and fifth regions, separated from said third region by said fourth and fifth regions, and having a sixth doping concentration substantially higher than said fourth concentration; a second junction between said fourth and sixth regions having a portion terminating at an exterior surface of said semiconductor layer; and wherein said area on said semiconductor layer covered by said gate electrode extends from said location proximte said terminated portion of said first junction to a location proximate said terminated portion of said second junction, whereby said sixth region is in said current path connecting together said third region and said second electrode.

26. The semiconductor device according to claim 16 wherein
   (a) said semiconductor layer further comprises a fifth region, said fifth region being doped to said opposite conductivity type, adjoining said fourth region, being separated from said third region by said fourth region, and having a fifth doping concentration substantially higher than said fourth concentration; and
   (b) said second electrode is further electrically connected to said layer fifth region.

27. The device according to claim 16 wherein said first interface lies substantially in a single plane and the center of said substrate second region is situated between said plane and said second substrate surface.

28. The semiconductor device accoridng to claim 16 wherein said second region comprises a grid.

29. The semiconductor device according to claim 16 wherein said second region comprises a plurality of spaced apart segments.

30. The semiconductor device according to claim 29 wherein said second region comprises a plurality of spaced apart elongated segments.

31. The device according to claim 19 wherein a minor portion of said third region adjoining said substrate first surface and separating said third region major portion from said substrate is doped to a sixth concentration substantially higher than said third concentration, but lower than said first concentration.

* * * * *